(12) United States Patent
Kosonocky et al.

(10) Patent No.: US 6,975,532 B1
(45) Date of Patent: Dec. 13, 2005

(54) QUASI-STATIC RANDOM ACCESS MEMORY

(75) Inventors: Stephen V. Kosonocky, Wilton, CT (US); Azeez Bhavnagarwala, Newtown, CT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/887,983

(22) Filed: Jul. 8, 2004

(51) Int. Cl.[7] ............................................. G11C 11/00
(52) U.S. Cl. .................. 365/154; 365/156; 365/230.05
(58) Field of Search ............................... 365/154, 156, 365/230.05

(56) References Cited

U.S. PATENT DOCUMENTS

| | | | |
|---|---|---|---|
| 6,091,627 A * | 7/2000 | Luo et al. ..................... | 365/154 |
| 6,285,580 B1 * | 9/2001 | Phan et al. ................... | 365/156 |
| 6,744,661 B1 * | 6/2004 | Shubat ........................ | 365/156 |

* cited by examiner

*Primary Examiner*—Anh Phung
(74) *Attorney, Agent, or Firm*—Satheesh K. Karra; Harrington & Smith, LLP

(57) ABSTRACT

A quasi-static random access memory cell exhibits increased READ mode operation stability by statically storing the cell logic value during idle periods and dynamically storing the cell logic value during READ mode operation.

7 Claims, 8 Drawing Sheets

QUASI-STATIC RANDOM ACCESS MEMORY

FIELD OF THE INVENTION

The present invention relates to quasi-static random access memories which eliminate READ mode operation instability caused by random mismatches of threshold voltages between adjacent devices comprising the memory by storing the cell logic value statically during idle periods and storing the cell logic value dynamically during READ mode operations.

BACKGROUND OF THE INVENTION

A typical six-transistor (6T) cell used for CMOS static random access memories (SRAM) consists of two cross-coupled CMOS inverters that store one bit of information, and two n-type FET isolation transistors on both sides of the cell that connect the cell to bitline BL and bitline complement BLN, respectively. The value of the cell is stored at one output of the inverter and the other output of the inverter is the inverse or complement of the cell value. The isolation transistors protect the value stored in the cell during precharging. The size of the isolation transistor is selected to optimize the circuit operation. A wordline control signal allows the cell to be accessed for reading or writing when needed and turns off access to the cell otherwise.

To write new data into the cell, external tristate drivers are activated to drive the bitline BL and bitline complement BLN when the wordline transistors are enabled. Since the external drivers are much larger that the small transistors used in the 6T SRAM cell, they easily override the previous state of the cross-coupled inverters. A short-circuit condition arises (for a fraction of the WL select period) when changing the information.

To read information, the wordline is activated while the external bitline drivers are switched off. Therefore, the inverters inside the SRAM cell drive the bitlines, whose value can be read-out by external logic.

The bitlines are precharged with wordline low (or off). Precharging enables the charging of both bitlines before a write or read operation. Once the proper bitline value is selected/written, the other bitline is discharged.

Current 6T SRAM cells suffer from Read mode operation instability caused by a random mismatch in threshold voltages (VTs) between adjacent transistors and devices within the cell. A dopant implant is used to set the activation threshold of the MOS transistors. The total number of dopant atoms is a function of the area under the gate of a MOS transistor. As technology scales down, the area under the gate of a MOS transistor is reduced so much so that the number of dopant atoms becomes a statistically significant variable, and can cause large random mismatches in activation threshold voltages of neighboring devices.

FIG. 1 shows a conventional 6T SRAM cell. The SRAM cell includes a first inverter comprising NFET N1 and PFET P1 with its output at storage node S1. The SRAM also includes a second inverter NFET N2 and PFET P2 with its output at storage node S2. Storage node S1 is connected to the gates of NFET N2 and PFET P2 and storage node S2 is connected to the gates of NFET N1 and PFET P1 in a cross-coupled configuration. During a READ mode operation of a conventional SRAM, the bitline (BL) and the bitline complement (BLN) are initially precharged to VDD and then set into a high impendence state. The wordline (WL) is then activated and the n-type FET isolation transistors N3 and N4 are turned on to sense the state of the respective storage nodes S1 and S2, which act to discharge either bitline BL or bitline complement BLN depending on the stored state. For example, if storage node S1 is at a low logic level and transistor N1 has an abnormally high-VT caused, for example, by random dopant implant fluctuation and isolation transistor N3 has a low VT also caused, for example, by a random dopant implant fluctuation, the charge on the bitline BL could cause storage node S1 to rise sufficiently high to flip the level at storage node S2 before its value is sensed thereby causing the circuit to fail and lose its proper state. Other combinations of threshold voltage mismatch and operating point mismatch can cause similar READ mode operation failures in a conventional SRAM. The problem with the conventional 6T SRAM cell is that during a READ mode operation, the storage nodes S1 and S2 are directly coupled to the bitline and the bitline complement, and thus are susceptible to charge sharing effects. In the case of a conventional 6T SRAM cell, allowing longer READ times will not help correct the stability problem since the bit will have already failed and lost the stored data.

In order to overcome this problem and to prevent the charge sharing effects during the READ mode operation the storage nodes are decoupled from the respective bitlines with isolation transistors. The modified cell now works in a "quasi-static" mode. During a READ mode operation the cell logic value is stored dynamically and during idle periods or when the cell is not accessed the cell logic value is stored statically as in a conventional 6T SRAM cell.

SUMMARY OF THE INVENTION

The basic principle of the invention resides in the quasi-static operation of the RAM cell. During idle periods or when the cell is not accessed the cell logic value is stored statically, using cross-coupled inverters similar to that in the 6T SRAM cell, while during READ mode operations, the logic values at the storage nodes are decoupled from the bitline BL and bitline complement BLN and are held dynamically by the charge stored on the gates of the transistors P1 and N1 and P2 and N2 shown in FIG. 2. The use of a high clock rate results in a very short access time which, in turn, allows dynamic charge storage without the inclusion of any additional capacitance.

In one embodiment of the invention shown in FIG. 2, a 8T quasi-static RAM cell has dual wordlines. Wordline WL controls the isolation transistors and write wordline WLW controls two additional n-type FET transistors N5 and N6 (making a 6T cell a 8T cell). The transistors N5 and N6 are located between the output storage nodes S1, S2 of a respective inverter and the input of the other inverter forming the cross-coupled inverters of the memory cell and between the output storage nodes S1, S2 and the PFET of the inverter. When these additional transistors N5, N6 are off, they isolate the storage nodes S1 and S2. By using signals on the wordline WL to control the states of the isolation transistors N3, N4 and signals on the write wordline WLW to control the states of the additional transistors N5, N6 it is possible to store the output of the memory cell statically during idle periods and dynamically during READ mode operations.

In another embodiment of the invention the additional transistors are selected to be p-type FET transistors and only a single wordline is coupled to both of the isolation transistors and both of the additional transistors for controlling the states of all of the transistors responsive to a signal on the wordline. This arrangement enables the storing of the memory cell output statically during idle periods and dynamically during READ mode operation using a single wordline.

The timing constraints imposed by the quasi-static RAM cell operation can be mitigated by delaying refresh every few cycles of the operation of the quasi-static RAM memory cell in a manner similar to a typical dynamic random access memory.

In order to balance the cell leakage, devices having multiple different threshold voltages may be used. For example, selecting low voltage threshold devices for the p-type FET transistors and selecting high threshold voltage devices for the n-type FET transistors pull down devices can balance the cell leakage.

A principal object of the present invention is, therefore, the provision of a quasi-static random access memory that exhibits increased READ mode operation stability.

A further object of the present invention is the provision of a quasi-static random access memory which eliminates READ mode operation instability caused by random mismatches of threshold voltages between devices comprising the memory.

Another object of the present invention is the provision of a quasi-static random access memory which stores the cell logic value statically during idle periods and stores the cell logic value dynamically during READ mode operations.

A still other object of the present invention is the provision of a quasi-static 8T random access memory cell.

A still further object of the present invention is the provision of a quasi-static 8T random access memory cell having dual wordlines.

A yet further object of the present invention is the provision of a quasi-static 8T random access memory cell having a single wordline with three state wordline logic.

Another object of the present invention is the provision of a quasi-static random access memory cell including devices having multiple threshold voltages in order to balance cell leakage.

An object of the present invention is the provision of delaying the refresh of a random access memory cell in order to mitigate the timing restraints imposed by the invention.

Further and still other objects of the present invention will become more clearly apparent when the following description is read in conjunction with the accompanying drawings.

DETAILED DESCRIPTION OF THE INVENTION

Figure 2:
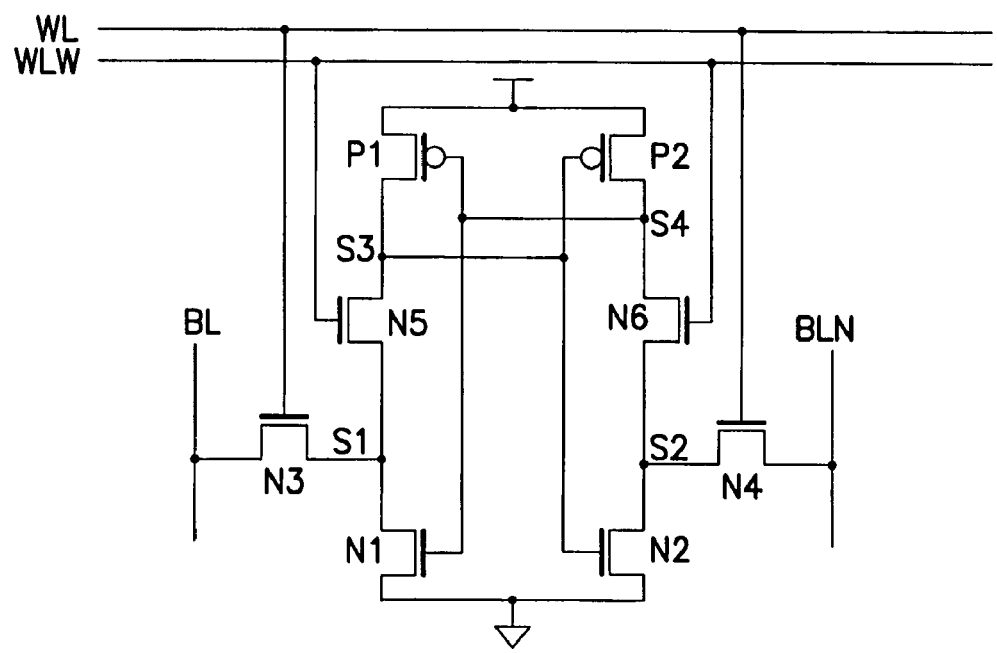
FIG. 2 is a schematic circuit diagram of a Quasi-Static 8T RAM Cell having dual wordlines.
Figure 3:
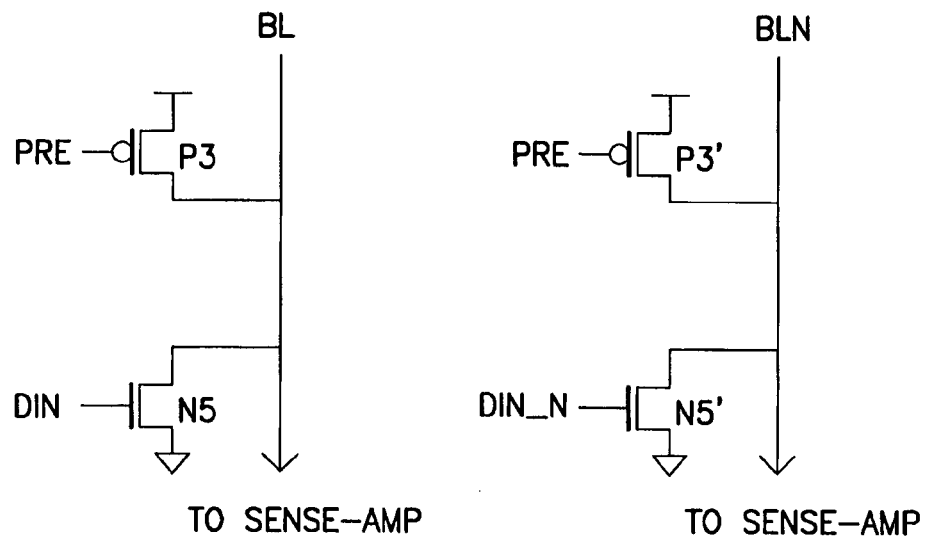
FIG. 3 is a schematic circuit diagram of a bitline conditioning circuit used in conjunction with the Quasi-Static 8T RAM Cell shown in FIG. 2.

Referring now to the figures and to FIG. 2 in particular, there is shown an embodiment of a Quasi-Static 8T RAM cell having dual wordlines WL and WLW and isolation devices N5 and N6. A bitline conditioning circuit is shown in FIG. 3. The bitline conditioning circuit includes a p-type FET transistor P3 whose drain is connected to bitline BL and a p-type FET transistor P3' whose drain is connected to bitline complement BLN. The source of both transistors P3 and P3' are connected to VDD. The gates of both transistors P3 and P3' are connected to precharge signal PRE. A first n-type FET transistor N5 has its source connected to BL and a second n-type FET transistor N5' has its source connected to BLN. The drains of both transistors N5 and N5' are connected to ground potential. The gate of the transistor N5 is connected to signal DIN and the gate of transistor N5' is connected DIN_N. In the Quasi-Static 8T RAM cell shown in FIG. 2, a READ mode operation is performed in a manner similar to that of the conventional SRAM case where the bitline and bitline complement are precharged to VDD prior to the READ mode operation. The precharging of the bitline and bitline complement is achieved by PRE signals turning on transistor P3 and P3' in the bitline conditioning circuit, thereby connecting the bitline BL and bitline complement BLN to VDD.

Figure 4:
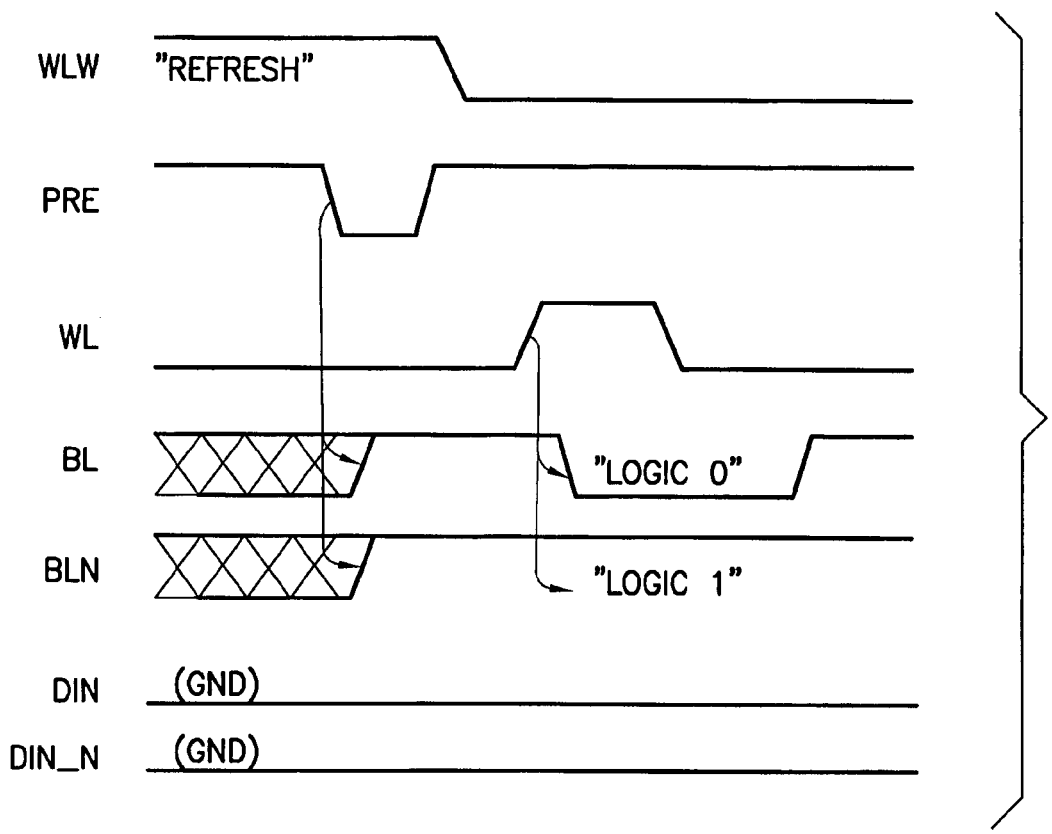
FIG. 4 is a timing diagram showing the waveforms of signals in the Quasi-Static 8T RAM Cell shown in FIG. 2 during READ mode operation of "logic 0" data.

FIG. 4 shows a timing diagram of the READ mode operation of the cell shown in FIG. 2 for a "logic 0" value. The signal on write wordline WLW provides a refresh signal during which time a precharge signal PRE causes the bitline BL and bitline complement BLN to assume the logic "1" level. When the wordline WL signal assumes a "logic 1" level and isolation transistors N3 and N4 (FIG. 2) turn on, the bitline BL assumes a "logic 0" level. During the entire READ mode operation, the DIN and DIN_N signals remain at the "logic 0" level. The difference of the signals at the storage nodes S1 and S2 is detected. The write wordline (WLW) is then deactivated during a READ mode operation and the storage nodes S3 and S4 are isolated from the charge sharing effects resulting from coupling the bitline BL and bitline complement BLN to the nodes S1 and S2. For the Quasi-Static 8T SRAM cell shown in FIG. 2, if device N1 has a high threshold voltage VT and device N2 has a low threshold voltage VT caused by random dopant implant fluctuations, the storage node S1 and S2 will eventually charge to the proper states given sufficient time since the gates of devices N1 and N2 are connected to storage nodes S3 and S4 which are isolated from the charge sharing effects during the READ mode operation. In this case, a defective cell caused by widely different threshold voltages will always be readable provided sufficient time is allowed for the READ mode operation. As described above, the cell logic value is stored dynamically during the READ mode operation.

Figure 1:
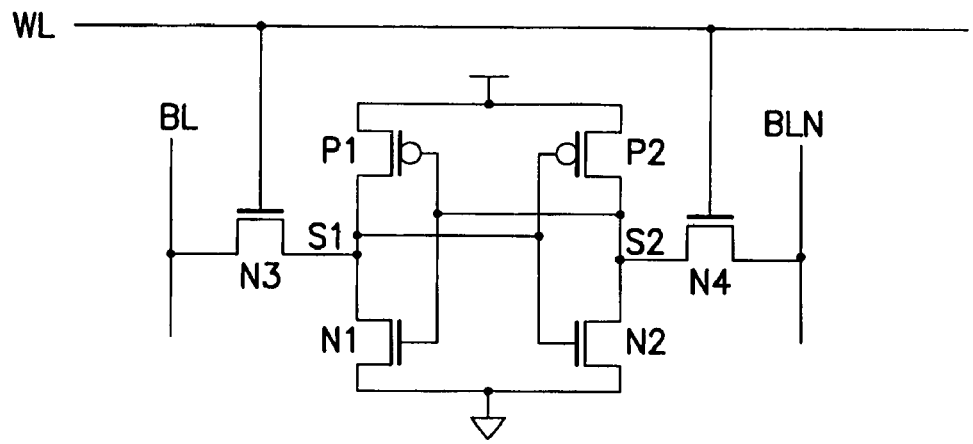
FIG. 1 is a schematic circuit diagram of a conventional 6T SRAM cell.
Figure 5:
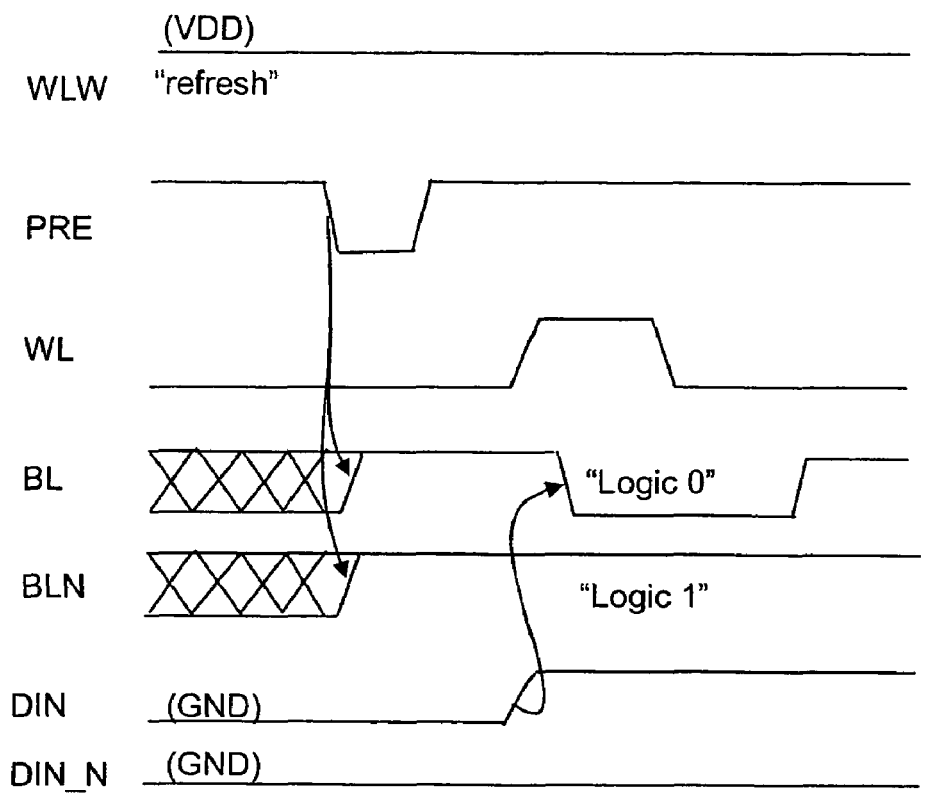
FIG. 5 is a timing diagram showing the waveforms of signals in the Quasi-Static 8T RAM Cell shown in FIG. 2 during WRITE mode operation of "logic 0" data.

The WRITE mode operation of the cell shown in FIG. 2 operates in the same manner as a conventional 6T SRAM cells, except that both wordline (WL) and write wordline (WLW) are activated to complete the feedback loop of the QSRAM cell and expose all the storage nodes to the new data as described in conjunction with FIG. 1. FIG. 5 shows the timing diagram of the WRITE mode operation of the cell shown in FIG. 2.

To refresh the cell storage node, the wordline (WL) is deactivated (held at a "logic 0" level) and the write wordline (WLW) is activated (held at a "logic 1" level). The refresh operation restores the internal node voltages to the static levels in a similar manner to that of a conventional 6T SRAM cell. This is the default state of the timing signals shown at the beginning of the waveforms in FIG. 4 and FIG. 5.

During the WRITE mode operation for writing a "logic 1" level shown by the timing diagram in FIG. 5, the DIN signal assumes the "logic 1" level when the signal on writeline WL assumes the "logic 1" level. The device N2 (FIG. 3) is turned on and the bitline BL signal is driven to a "logic 0" level.

Figure 6:
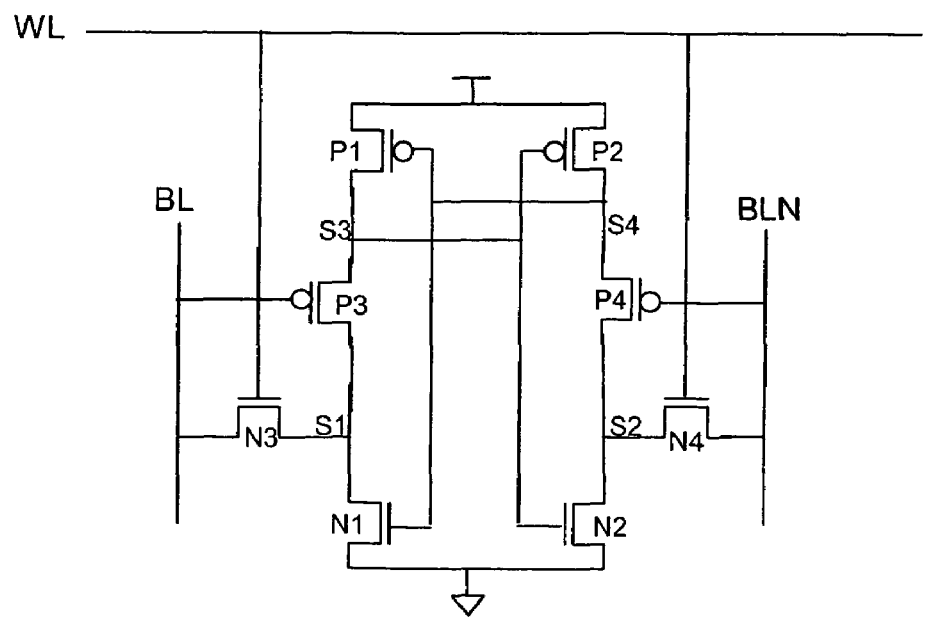
FIG. 6 is a schematic circuit diagram of a Quasi-Static 8T RAM Cell having a single wordline.

In order to obviate the requirement of dual wordlines, an alternative embodiment of a Quasi-Static RAM cell having a single wordline is shown in FIG. 6. The Quasi-Static 8T RAM cell operates in a similar manner to the cell shown in FIG. 2, except the N-type isolation devices N5 and N6 shown in FIG. 2 are changed to P-type devices P3 and P4 shown in FIG. 6. By using an opposite polarity device for devices P3 and P4 for isolating of storage nodes S3 and S4 from the isolation devices N3 and N4, it is possible to use the bitline BL and bitline complement BLN signals to assist in the operation of the cell by virtue of their connection to the gate terminals of devices P3 and P4.

Figure 7:
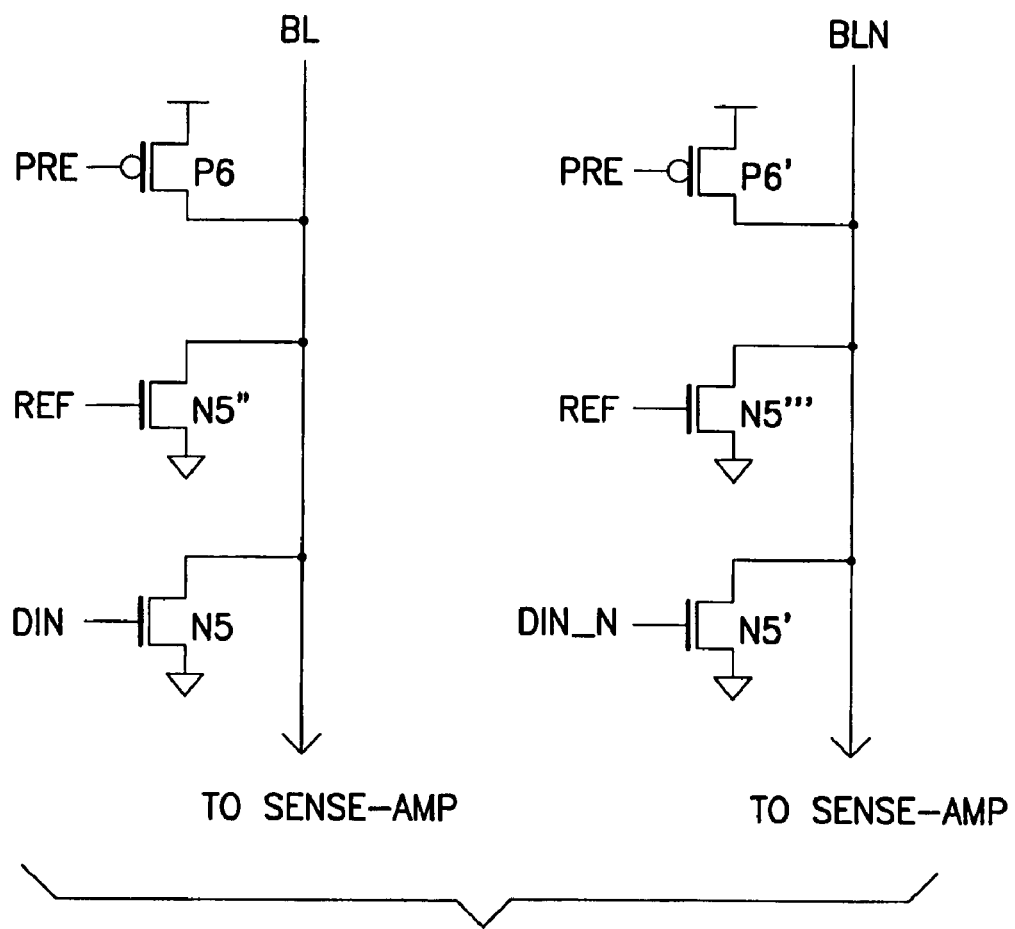
FIG. 7 is a schematic circuit diagram of a bitline conditioning circuit used in conjunction with the Quasi-Static 8T RAM Cell shown in FIG. 6.
Figure 8:
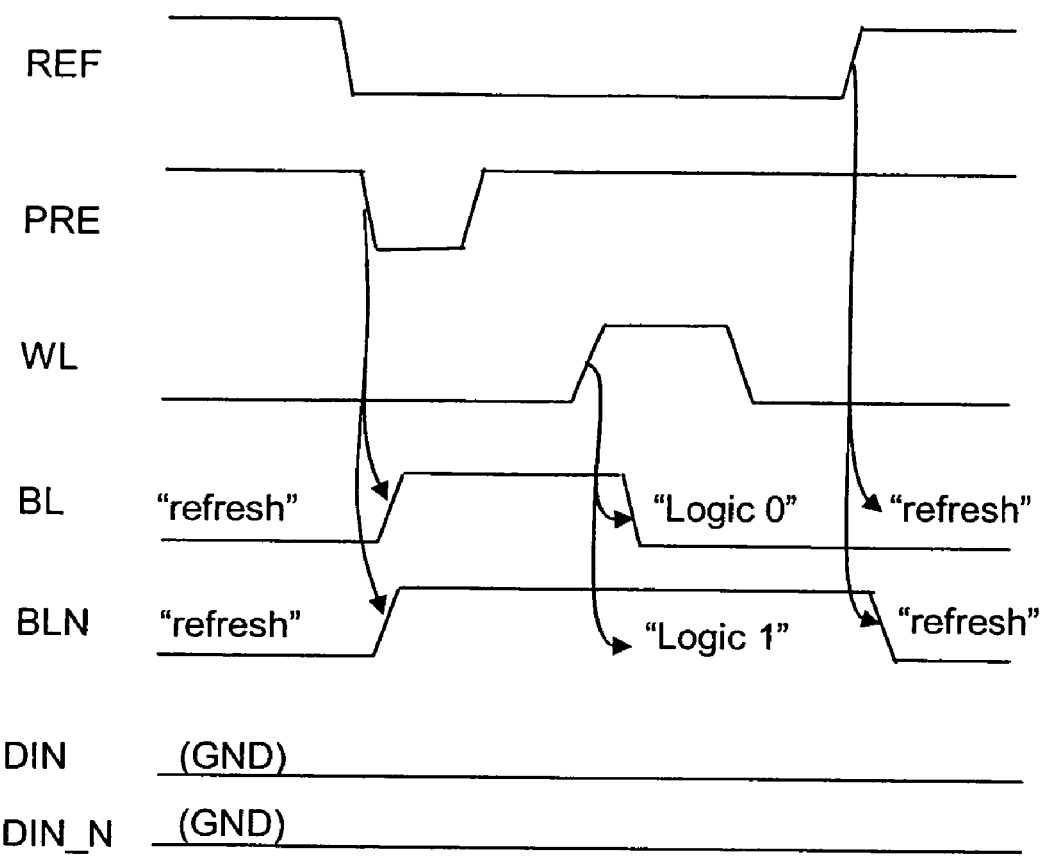
FIG. 8 is a timing diagram showing the waveforms of signals in the Quasi-Static 8T RAM Cell shown in FIG. 6 during READ mode operation.
Figure 9:
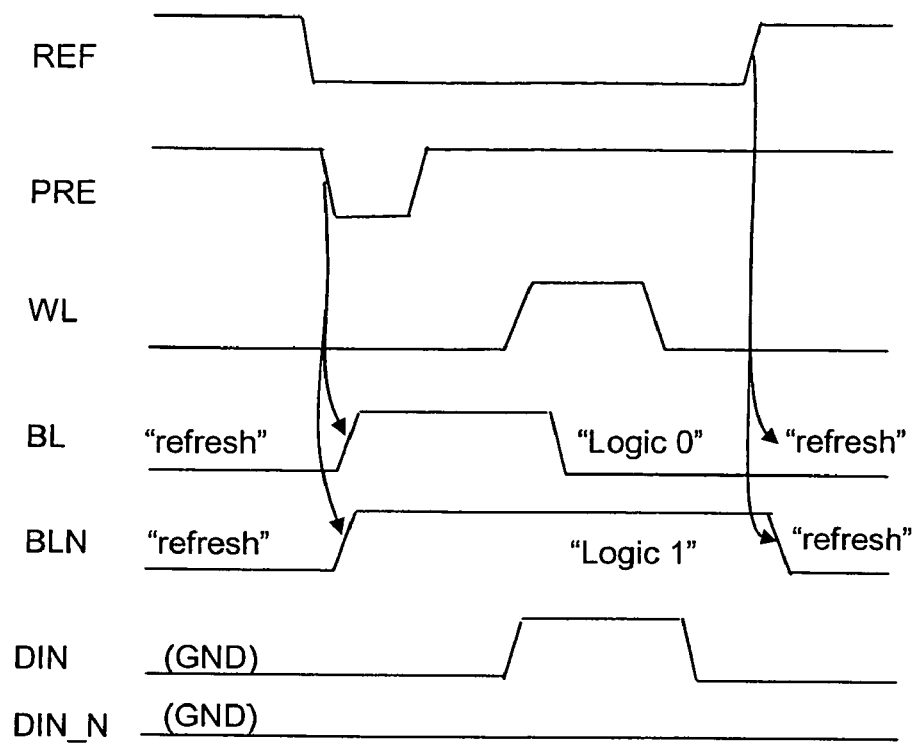
FIG. 9 is a timing diagram showing the waveforms of signals in the Quasi-Static 8T RAM Cell shown in FIG. 6 during WRITE mode operation.

In the cell shown in FIG. 6, the bitline BL and the bitline complement BLN are normally pre-charged to GND potential when not being accessed by asserting the REF signal as shown in FIG. 7 and described in conjunction with the timing diagrams shown in FIG. 8 and in FIG. 9. In the bitline conditioning circuit shown in FIG. 7 the precharge signal PRE is connected to the gates of p-type transistors P6 and P6' and the DIN and DIN_N signals are connected to the gates of n-type transistors N5 and N5'. The sources of transistors N5 and N5' are connected to bitline complement BLN, respectively. The drains of transistors P6 and P6' are connected to BL and BLN, respectively. The sources of transistors P6 and P6' are connected to VDD. The drains of transistors N5 and N5' are connected to ground potential. The gates of two additional n-type transistors N5" and N5'" are connected to a refresh signal REF. The sources of the transistors N5" and N5'" are connected to bitline BL and bitline complement BLN, respectively. The drains of the transistors N5" and N5'" are connected to ground potential. The cell is refreshed by the turning ON isolation transistors P6 and P4 (FIG. 6) and completing of the feedback loop of the cell, thereby restoring the state values to the storage nodes S3 and S4. The low level of the cell storage nodes S3 and S4 are approximately equal to a PFET threshold (Vtp) above the GND potential. In order to avoid excessive cell leakage, the device thresholds of the PFETs P6 and P4 need to be balanced with the thresholds of devices N1 and N5, pull-down NFETs, so that a low potential on a storage node S3 or S4 will complete the turn-off of the pull-down devices N1 and N5 if needed, to satisfy leakage requirements of the cell. Multiple threshold (Multi-Vt) devices can be used to achieve this balance, either by using very low Vt devices for PFET P6 and P4 or high Vt devices for N1 and N5.

FIG. 7 shows the bitline BL and bitline complement BLN conditioning circuits and FIG. 8 shows the single-wordline Quasi-Static RAM cell waveforms during READ mode operation of the circuit shown in FIG. 6. During a READ mode operation the REF signal is deactivated prior to the PRE signal being activated. This will pre-charge both the bitline BL and bitline complement BLN to the VDD level. This causes the isolation devices P3 and P4 in FIG. 6 to turn off, isolating the cell storage nodes S3 and S4. The wordline WL is then activated and the logic state is read from the storage cell (in this case S1 is storing a "logic 0"), and the associated bitline is discharged toward GND. As the bitline discharges, the isolation device associated with that bitline is turned-on after the cell has read the correct logic value. Balancing the turn-on level with the bitline level can be achieved by appropriately selecting the device threshold for devices P3 and P4 so that they do not turn-on until the bitline is fully discharged safely to prevent a READ disturb on the cell. Hence, the cell logic value is stored dynamically during a READ mode operation. Once the READ mode operation is complete, the wordline WL is deactivated and the cell is put back into the REFRESH mode by asserting the REF signal and discharging both the bitline BL and bitline complement BLN to GND.

A WRITE mode operation is similar to the READ mode operation and is described in conjunction with the waveforms shown in FIG. 9. At the start of the WRITE mode operation, the REF signal is deactivated and the PRE signal is activated to pre-charge both the bitline BL and the bitline complement BLN to VDD. The write data will then selectively discharge a bitline BL or bitline complement BLN depending on the value. The wordline (WL) is activated and the cell storage nodes S1 and S2 are provided with new logic levels. In the example in FIG. 9, storage node S1 discharges to GND, device P3 turns-on, discharging storage node S3 to GND+Vt, storage node S2 charges to VDD, device P2 turns-on by S3 going low and storage node S4 charging to VDD. Once the WRITE mode operation is completed, the wordline (WL) is deactivated and the REF signal is activated to discharge both bitline BL and bitline complement BLN to allow the cell to refresh its logic state.

In an effort to ease timing constraints related to generating the REF and PRE signals, the REF signal can be applied occasionally or delayed every few cycles of operation during a "refresh" cycle, similar to a typical dynamic random access memory (DRAM) refresh. This procedure allows higher frequency operation by removing the requirement of a "refresh" operation between READ and WRITE cycles.

Figure 10:
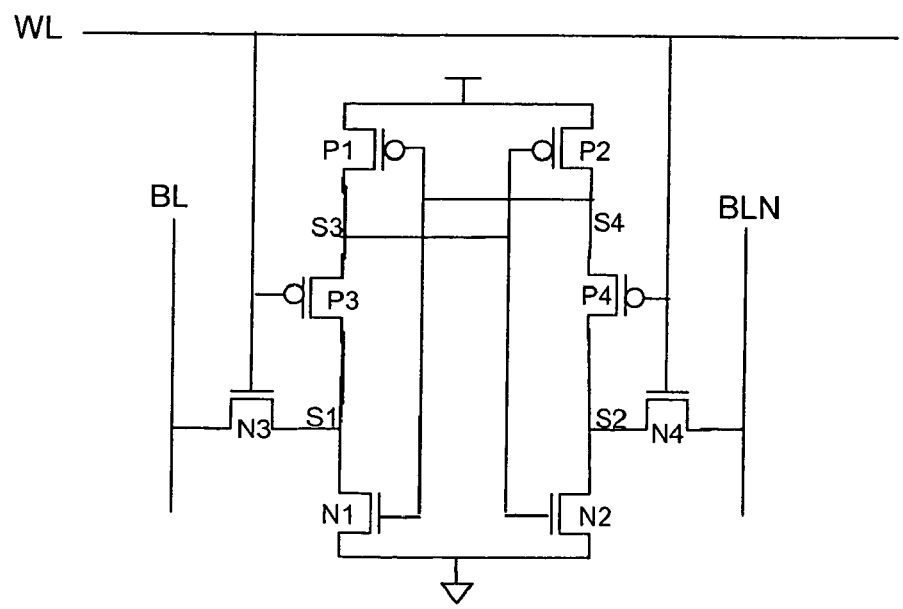
FIG. 10 is a schematic circuit diagram of a Quasi-Static RAM Cell having a single wordline with three state wordline logic.
Figure 11:
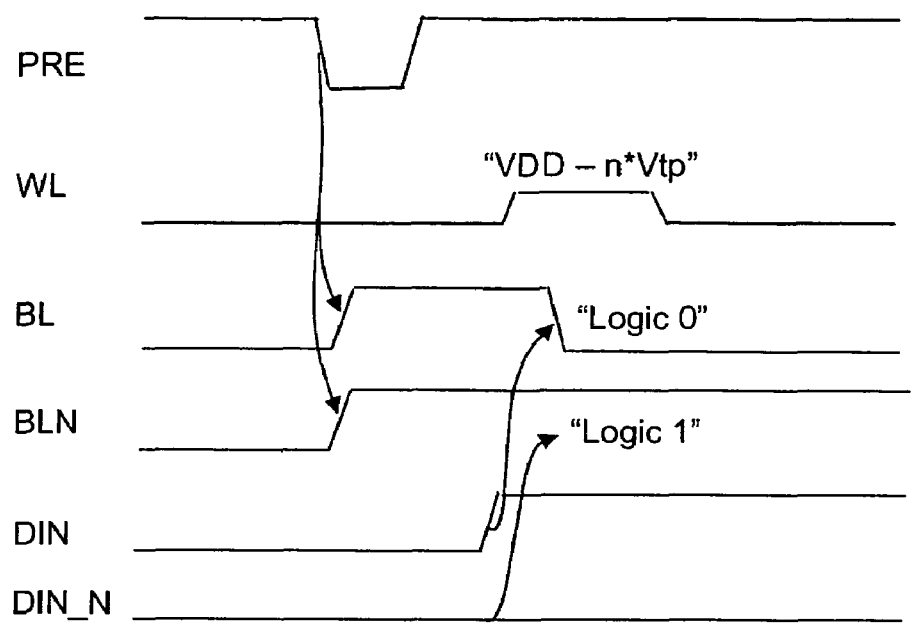
FIG. 11 a timing diagram showing the waveforms of signals in the Quasi-Static RAM Cell shown in FIG. 10 during WRITE mode operation.

Another embodiment of the invention shown in FIG. 10 is a single wordline Quasi-Static RAM cell using three state wordline logic. In this embodiment, PFET devices P3 and P4 are used for isolation of the cell storage nodes S3 and S4. A READ mode operation is performed in the same manner as described in conjunction with the embodiment shown in FIG. 2, except the write wordline WLW in FIG. 2 is not needed. In the embodiment in FIG. 10, when the wordline WL is asserted high, the devices N3 and N4 are turned on and the isolation devices P3 and P4 are turned off, and the cell is read in a similar manner to the dual wordline Quasi-Static RAM cell shown in FIG. 2. FIG. 11 shows the timing diagram for WRITE mode operation of the cell embodiment shown in FIG. 10. During a WRITE mode operation, the wordline (WL) is asserted to a mid-value logic level voltage VDD−n*Vtp where n*Vtp is a multiple of the PFET threshold voltage (Vtp). In this case the isolation devices P3 and P4 are partially ON during WRITE mode operations and the isolation devices N3 and N4 are partially ON during WRITE mode operations, allowing the asserted bitline logic states to be written on to the cell storage nodes S3 and S4. The isolation devices P3 and P4 have the function of being in a very high impedence state (OFF) during READ mode operations by wordline (WL) being at the VDD level, and a mid-impedance state during WRITE mode operation to expose the cell storage nodes to the external bitline logic levels for writing data.

Figure 12:
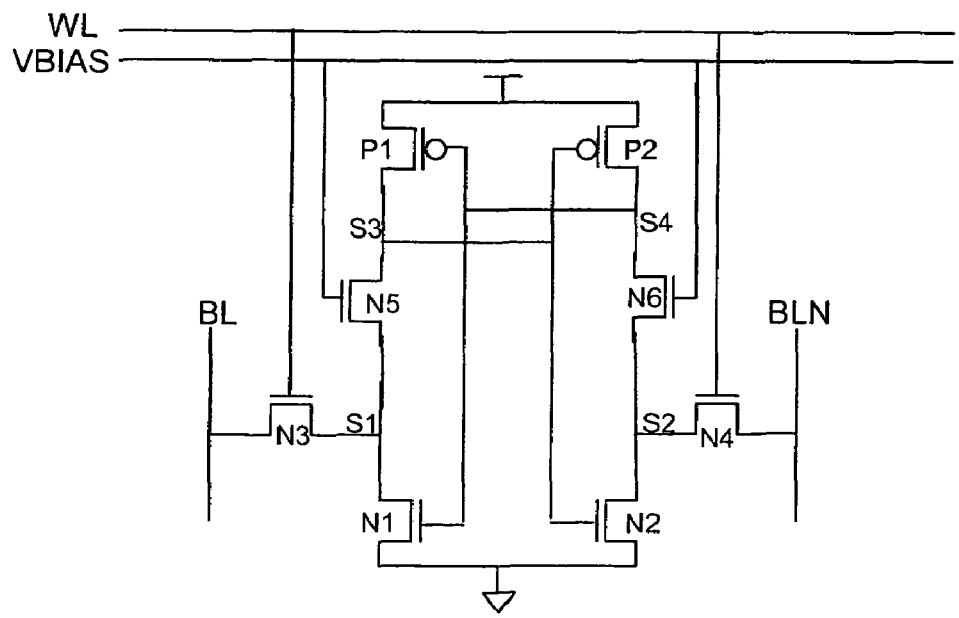
FIG. 12 is a schematic circuit diagram of a single wordline Quasi-Static RAM cell with resistive isolation.
Figure 13:
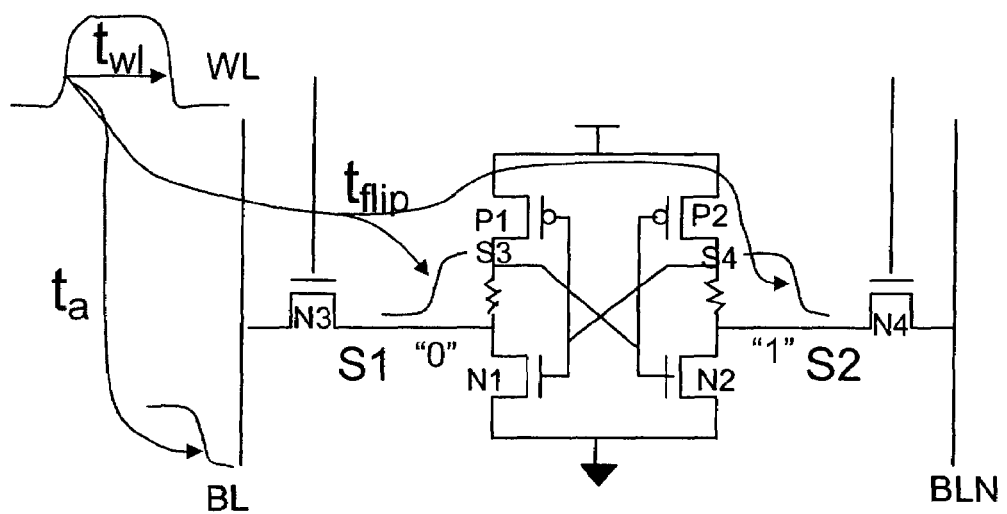
FIG. 13 is a schematic diagram of an effective model of a single wordline Quasi-Static RAM cell with resistive isolation.

Another embodiment of the invention shown in FIG. 12 is a variant of the embodiment shown in FIG. 10. In FIG. 12, the isolation devices P3 and P4 (FIG. 10) are replaced by NFET devices N5 and N6 that are biased to a constant DC bias level VBIAS. In this case the wordline WL and the bitline BL and bitline complement BLN are excited in the same manner as in a conventional SRAM cell. For the example shown in FIG. 13, illustrating the effective circuit model of the circuit of FIG. 12, the cell storage nodes S1 and S3 are holding a "logic 0" value and storage nodes S2 and S4 are holding a "logic 1" value. During a READ mode operation, if the voltage at storage node S1 is increased by the voltage divider between the access transistor N3 and pull-down NFET N1 to a high level, the static resistor N5 (in FIG. 12) will lower the voltage, slowing the transition of the voltage at storage node S3 toward VDD. If the time to flip the cell ($t_{flip}$) is adjusted to be longer then the wordline pulse ($t_{wl}$) necessary to discharge the bitline to the level needed for sensing a signal (time, $t_a$), the cell will have a higher immunity from upset during READ mode operations.

While there have been described and illustrated a preferred embodiment and several alternative embodiments of the present invention, it will be apparent to those skilled in the art that further and still other embodiments of the invention are possible without deviating from the spirit and broad teachings of the present invention which shall be limited solely by the scope of the claims appended hereto.

What is claimed is:

1. A quasi-static random access memory cell comprising:
    a memory cell comprising two cross-coupled inverters each inverter having an output and a pair of transistors with the output of each inverter coupled to the input of the other inverter;
    first isolation devices disposed for isolating one of said outputs from a bitline and for isolating the other of said outputs from a bitline complement; and
    second isolation devices in each inverter disposed between a first point between the pair of transistors of the inverter and the output of the inverter and the first point also connected to the input of the other inverter so that said outputs are capable of being isolated, whereby the outputs are statically stored during idle periods and dynamically stored during READ mode operation.

2. A quasi-static random access memory cell as set forth in claim 1, where said pair of transistors comprises a n-type FET transistor and a p-type FET transistor.

3. A quasi-static random access memory cell as set forth in claim 1, where said first isolation devices are n-type FET transistors.

4. A quasi-static random access memory cell as set forth in claim 1, where said second isolation devices are n-type FET transistors.

5. A quasi-static random access memory cell as set forth in claim 1, further comprising a bitline conditioning circuit for conditioning the bitline and bitline complement.

6. A quasi-static random access memory cell as set forth in claim 5, where said bitline conditioning circuit precharges the bitline and the bitline complement.

7. A quasi-static random access memory cell comprising:
    a memory cell comprising two cross-coupled inverters each inverter having an output and a pair of transistors with the output of each inverter coupled to the input of the other inverter;
    first isolation devices disposed for isolating one of said outputs from a bitline and for isolating the other of said outputs from a bitline complement;
    second isolation devices comprising n-type FET transistors in each inverter disposed between a first point between the pair of transistors of the inverter and the output of the inverter and the first point also connected to the input of the other inverter so that the outputs of the memory cell are capable of being isolated;
    a wordline coupled to said first isolation devices for controlling the states of said first isolation devices responsive to a signal on said wordline; and
    a constant bias level coupled to said second isolation devices, whereby the memory cell outputs are statically stored during idle periods and dynamically stored during READ mode operation.

* * * * *